(12) United States Patent
Ruths

(10) Patent No.: US 8,780,640 B2
(45) Date of Patent: Jul. 15, 2014

(54) SYSTEM AND METHOD TO ENABLE READING FROM NON-VOLATILE MEMORY DEVICES

(75) Inventor: Paul F. Ruths, Woodland Park, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 279 days.

(21) Appl. No.: 13/331,405

(22) Filed: Dec. 20, 2011

(65) Prior Publication Data

US 2013/0141983 A1 Jun. 6, 2013

Related U.S. Application Data

(60) Provisional application No. 61/566,404, filed on Dec. 2, 2011.

(51) Int. Cl.
*G11C 16/28* (2006.01)

(52) U.S. Cl.
USPC .............. 365/185.21; 365/185.2; 365/185.02; 365/185.29; 365/189.011; 365/189.09

(58) Field of Classification Search
USPC ............... 365/185.21, 185.2, 185.02, 189.09, 365/189.11, 210.11, 210.02, 210.1, 185.29
See application file for complete search history.

(56) References Cited

U.S. PATENT DOCUMENTS

| | | | |
|---|---|---|---|
| 7,599,220 B2 * | 10/2009 | Lin et al. | 365/185.2 |
| 2006/0215459 A1 * | 9/2006 | Hsieh et al. | 365/185.29 |
| 2008/0002452 A1 * | 1/2008 | Augustin et al. | 365/103 |
| 2008/0120526 A1 * | 5/2008 | Eguchi et al. | 714/773 |

* cited by examiner

*Primary Examiner* — Richard Elms
*Assistant Examiner* — Mohammed A Bashar
(74) *Attorney, Agent, or Firm* — Lowenstein Sandler LLP

(57) ABSTRACT

A system and method to enable reading from non-volatile memory (NVM) devices is described. In one embodiment, the method includes setting a sensing parameter used to read data stored in a NVM device, reading from pluralities of locations of the NVM device with the sensing parameter set at the first value. The locations of the NVM device store an identical value. The method also includes verifying whether the identical value is read correctly from the locations of the NVM device. The method also includes setting the sensing parameter to a second value when the identical value is not read correctly with the sensing parameter set at the first value. The method further includes determining a third value for the sensing parameter from the identical value and setting the sensing parameter to the third value when the identical value is read correctly.

20 Claims, 6 Drawing Sheets

SYSTEM AND METHOD TO ENABLE READING FROM NON-VOLATILE MEMORY DEVICES

RELATED APPLICATIONS

This application claims the benefit of U.S. Provisional Application No. 61/566,404 filed on Dec. 2, 2011, which is incorporated by reference.

TECHNICAL FIELD

This disclosure relates to field of non-volatile semiconductor devices, and more particularly to enable reading from non-volatile memory devices at power up.

BACKGROUND

There is a need to remember state of conditions entered or derived in semiconductor devices whenever the devices are on. Typically, non-volatile memory (NVM) devices are used in computing systems to store a state of the computing system when the computing systems are turned off. When the computing systems are turned back on, the state is restored for proper operations. Currently, non-volatile memory latches (NVLs) are used as a data storage device for these computing systems to retain and provide data such as read parameters as well as certain configuration information at power up of the computing system. A typical NVL is a flip-flop used as a temporary storage device controlled by a timing signal, which can store 0 or 1. The NVLs automatically recall the parameters and configuration information at power-up that was previously written into them during testing or manufacturing. This information is generally used to control a circuitry of a semiconductor chip device. NVLs, however, require additional real estate on the silicon in addition to the NVM. Also, testing of the NVLs is non-trivial and special attention is needed to protect the controlling signals at power-up to ensure the recalled data from the NVLs. Thus, it is challenging to design a fool-proof power-up recall of data.

Another method to remember the parameters and other configuration information at power-up of the devices is to read them from non-volatile static random access memory (nvSRAM), which is similar to the NVLs mentioned above. Even another method to recall the parameters is to use off-chip memory which contains these parameters, but it presumes that the values of these parameters can be obtained for each particular chip and supplied on demand at the required time.

BRIEF DESCRIPTION OF THE DRAWINGS

The present invention is illustrated by way of example, and not of limitation, in the figures of the accompanying drawings in which.

DETAILED DESCRIPTION

Systems and methods are provided in the present application to enable reading from non-volatile memories at power up. Specifically, a sensing parameter is initially set to a first value to read data stored in a NVM device. Pluralities of identical values are read from a plurality of locations of the NVM device with the sensing parameter set to the first value. The sensing parameter is set to one or more second values when the identical value is not read correctly from the plurality of locations of the NVM device. When the identical value is read correctly, one or more third values are determined for the sensing parameter from the identical value and the sensing parameter is set to the one or more third values. The one or more third values are used for future readings of the NVM device. In one embodiment, the one or more third values are the optimal setting for the future readings of the NVM device.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Figure 1:
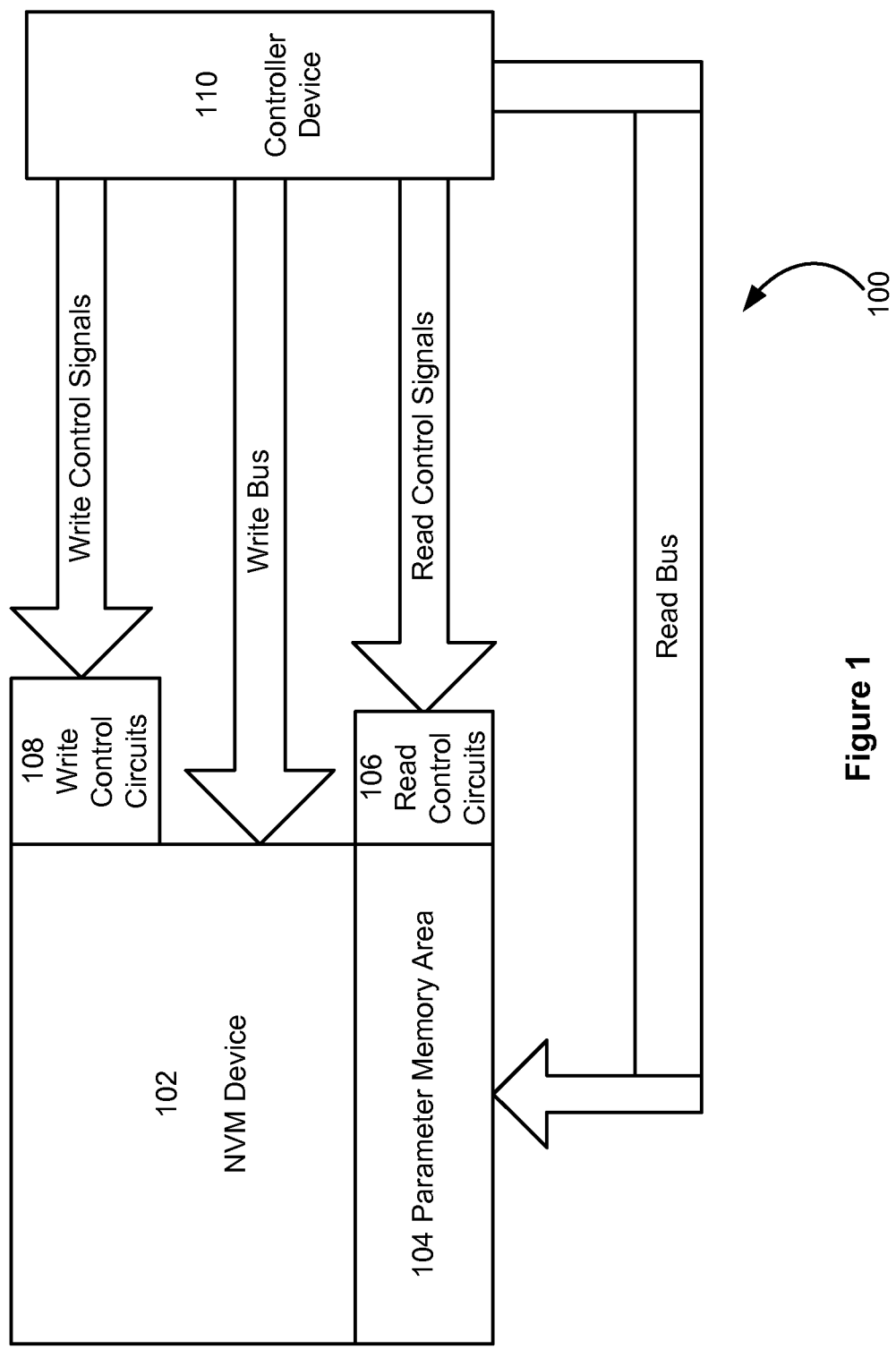
FIG. 1 is a block diagram illustrating a NVM system according to embodiments of the present invention.

FIG. 1 is a block diagram illustrating a NVM system 100 according to embodiments of the present invention. In one embodiment, the NVM system 100 includes a NVM device 102 and a controller device 110 in communication with the NVM device 102. The NVM device 102 includes a parameter memory area 104. In one embodiment, the NVM device 102 contains an array of NVM cells as described herein. The NVM system 100 also includes one or more read control circuits 106 in communication with the NVM device 102 which function to read data values from the parameter memory area 104 of the NVM device 102. The NVM system 100 also includes one or more write control circuits 108 in communication with the NVM device 102 which function to write data values into the NVM device 102.

In one embodiment, the controller device 110 includes on-chip hardware (such as a CPU and ROM/RAM) which functions to execute some mathematical operations using the data values read from the NVM device 102 and data values written into the parameter memory area 104 of the NVM device 102.

The parameter memory area 104 includes plurality of locations including an identical value and a pre-determined checksum of the identical values before power up typically determined and written into the parameter memory area 104 during manufacturing and/or testing of the NVM device 102. At power up, the controller device 110 functions to determine an identical value and a predetermined checksum of the identical values. The identical value and the predetermined checksum are written into the plurality of the locations of the parameter memory area 104 of the NVM device 102 by the write control circuit 108. In one embodiment, the pre-determined checksum is stored in another location of the plurality of locations of the NVM device 102. In one embodiment, upon power up, the controller device 110 functions to set a first sensing parameter used to read data from the locations in the parameter memory area 104 of the NVM device 102. In another embodiment, upon power up, the read control circuit 106 functions to read, from the locations, using the first sensing parameter. In one embodiment, each of the plurality of locations of the parameter memory area 104 stores an identical value and the pre-determined checksum. In alternate embodiment, less than all of the plurality of locations may store the identical value and the pre-determined checksum. In another embodiment, a single memory location may be used to store the identical value and the pre-determined checksum. In one example, data value is set to one or more recognizable bits in the single memory location. In another example, data value is set to a known bit pattern in the single memory location. The data value read from the single memory location is used to determine whether the two different values are read correctly and to check that they are the same or pre-determined in the same way. Alternatively, other methods may be implemented to verify the data in more than one location as appreciated by one skilled in the art.

The controller device 110 functions, using the first sensing parameter to verify whether the identical value is read correctly at the locations in the parameter memory area 104 of the NVM device 102. In one embodiment, the controller device 110 functions to set a second sensing parameter for reading from the locations in the parameter memory area 104 of the NVM device 102 when the identical value is not read correctly with the first sensing parameter. In another embodiment, the controller device 110 functions to determine, using the first sensing parameter, a third sensing parameter, when the identical value is read correctly with the first sensing parameter and to set the third sensing parameter used for future readings from the locations in the parameter memory are 104 of the NVM device 102. In one embodiment, the identical value stored in the locations is a value that represents the third sensing parameter. In another embodiment, value of the third sensing parameter is different from a value of the first sensing parameter.

In other embodiments, the read control circuit 106 functions to iteratively read out the data values from the plurality of locations from the parameter memory area 104 of the NVM device 102 until the identical value is read correctly. In another embodiment, the controller device 110 also calculates a checksum of the data values read from the locations of the parameter memory area 104. In one embodiment, the checksum calculated of the data values is the current checksum. In another embodiment, the controller device 110 functions to compare the checksum with the pre-determined checksum. In one embodiment, if the checksum comparison fails, the controller device 110 functions to set the second sensing parameter for reading from the locations in the parameter memory area 104 of the NVM device 102. In another embodiment, if the checksum comparison passes, the controller device 110 functions to set the third sensing parameter used for future readings from the locations in the parameter memory area 104 of the NVM device 102.

Figure 2:
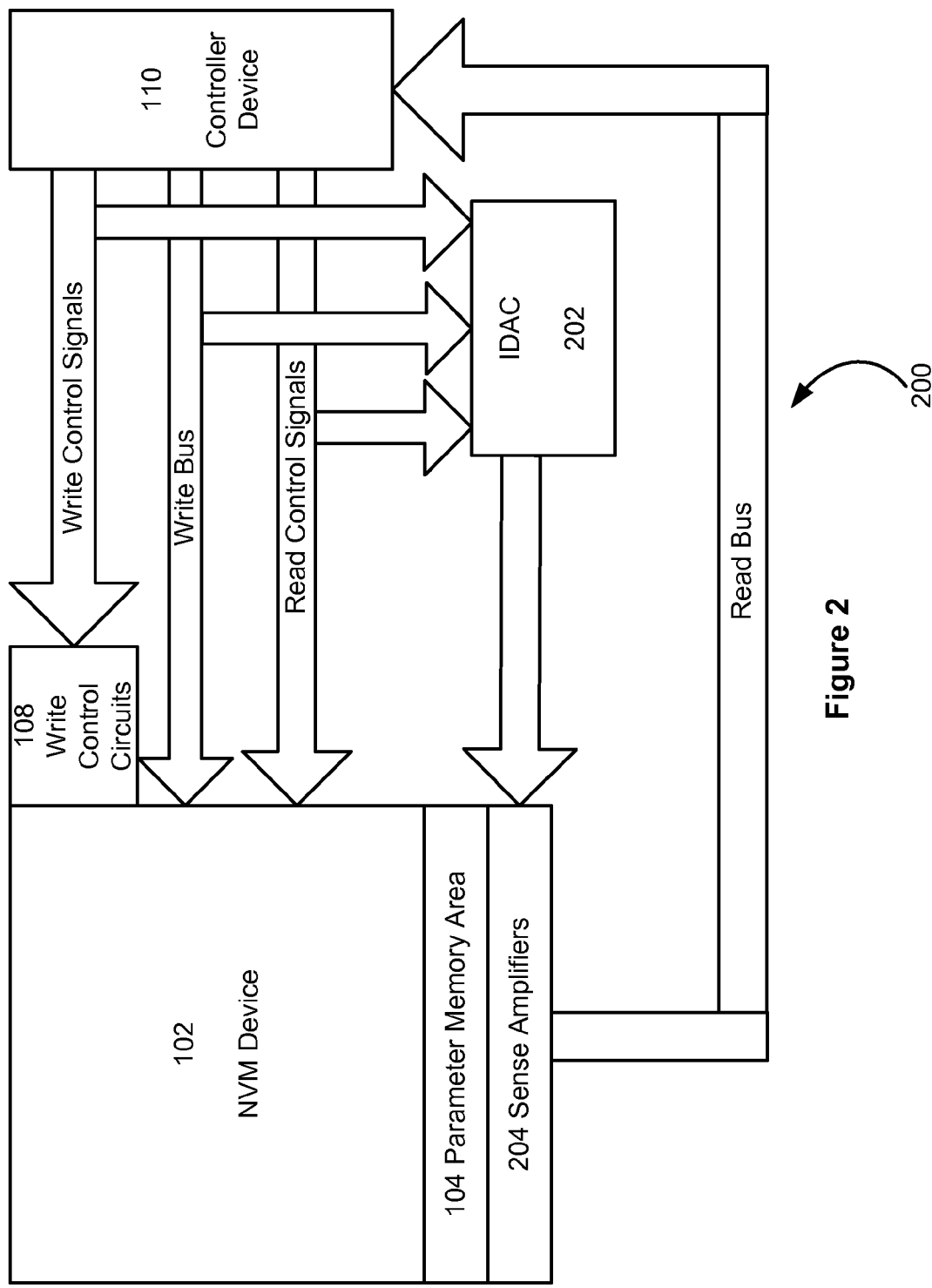
FIG. 2 is a block diagram illustrating the NVM system according to embodiments of the present invention.

FIG. 2 is a block diagram illustrating a NVM system 200 according to embodiments of the present invention. Similar to FIG. 1, the NVM system 200 includes the NVM device 102, write control circuit 108 and a controller device 110. In the embodiment of the NVM system 200, the read control circuit 106 of FIG. 1 is the one or more sense amplifiers 204 provided in the NVM device 102. The sense amplifier 204 functions to read the current flowing in the NVM device 102. The NVM system 200 also includes a current digital to analog converter (IDAC) 202 in communication with the controller device 110 and the one or more sense amplifiers 204. The IDAC 202 is a programmable current source. The IDAC 202 is configured to receive a digital value and provide a corresponding current. The IDAC 202 may be configured to receive the sensing parameter, such as the data value stored in the parameter memory area 104. When the IDAC 202 receives a different digital value, the IDAC 202 provides a different corresponding current. In this embodiment, the value of the sensing parameter is a current reference ($I_{ref}$) of a sensing window of the NVM device 102. Although in this embodiment described above, the value of the sensing parameter disclosed is the current reference ($I_{ref}$), one of ordinary skill in the art would appreciate that other sensing parameters such as voltage reference, power supply regulators, timings etc. may be used as the sensing parameters as would be appreciated by one of ordinary skill in the art having the benefit of this disclosure.

The current reference ($I_{ref}$) is selected to be approximately midway between an erased cell current and a programmed cell current. The $I_{ref}$ is converted into an analog current by the IDAC 202, also referred as the current reference ($I_{ref}$) and serves as an input to the sense amplifier 204. The sense amplifier 204 functions to read the current in the NVM device 102 which is compared against the current reference ($I_{ref}$). When the NVM device 102 conducts current more than the current reference ($I_{ref}$), the sense amplifier 204 outputs a "0" value and the NVM device 102 is regarded as an erased cell device (e.g. "ON" device). Conversely, when the NVM device 102 conducts less current than the current reference value ($I_{ref}$), the sense amplifier 204 outputs a "1" value and the NVM device 102 is regarded as a programmed cell device (e.g. "OFF" device). Prior to power up, (during production test) sensing parameter values and pre-determined checksum values are determined and written into the locations (such as bits) of the parameter memory area 104 by the write control circuit 108. In one embodiment, during manufacturing testing, the behaviors of the NVM device are characterized with respect to read and write in order to determine the sensing parameters values. Also, a pre-determined checksum is mathematically calculated for the plurality of locations using the sensing parameter values as described herein below. The sensing parameter values are current reference ($I_{ref}$) and slope. The current read from the NVM device 102 varies with temperature, and slope functions to cancel out effects of temperature variation on the effectiveness of the current read in the NVM device 102. So, slope is used to adjust the $I_{ref}$ behavior across temperature.

As an example, 5 bits are used for the $I_{ref}$ setting and 2 bits are used for slope setting both of which fit into a single 8 bit byte of the parameter memory area 104. So, during production test, 5 bytes are written to the same identical 8 bit value of the parameter memory area 104. This 8 bit value is the sensing parameter setting for the $I_{ref}$ and slope. Also, prior to power up, during production test, a 2 byte pre-determined checksum is calculated across these 5 bytes. For this example, the 2 byte pre-determined checksum is calculated as follows and written into the parameter memory area 104:

Pre-determined Checksum=0−((Sum of bytes 1 through 5)+0×*EB*)

0×EB above is a hexadecimal representation of the decimal value 235. Referring to the above example, upon power up, the controller device 110 functions to set or assign the 8 bit value to the sensing parameter. The sense amplifier 204 reads data values of the successive bytes from the 5 bytes that contain the $I_{ref}$ and slope. The read data values of the successive bytes are compared by the controller device 110 until a correct read of the data value of the 5 byte occurs. Upon such correct read of the data value of the 5 byte, the controller device 110 also calculates a current checksum for the 5 bytes that were read and compares with the pre-determined checksum. In one embodiment, if the checksum comparison fails, the controller device 110 functions to assign a new value to the $I_{ref}$ and the slope as the sensing parameter value and iteratively reads and compares the successive bytes from the 5 bytes using the new value for the $I_{ref}$ and slope. In another embodiment, if the checksum passes, the data value read from the 5 bytes is assigned the new value to the $I_{ref}$ and the slope and applied for future reads. Although in the example above 5 bits are used for the $I_{ref}$ setting and 2 bits are used for slope, a different number of bits may be used for the $I_{ref}$ setting and the slope as would be appreciated by one of ordinary skill in the art having the benefit of this disclosure.

Figure 3:
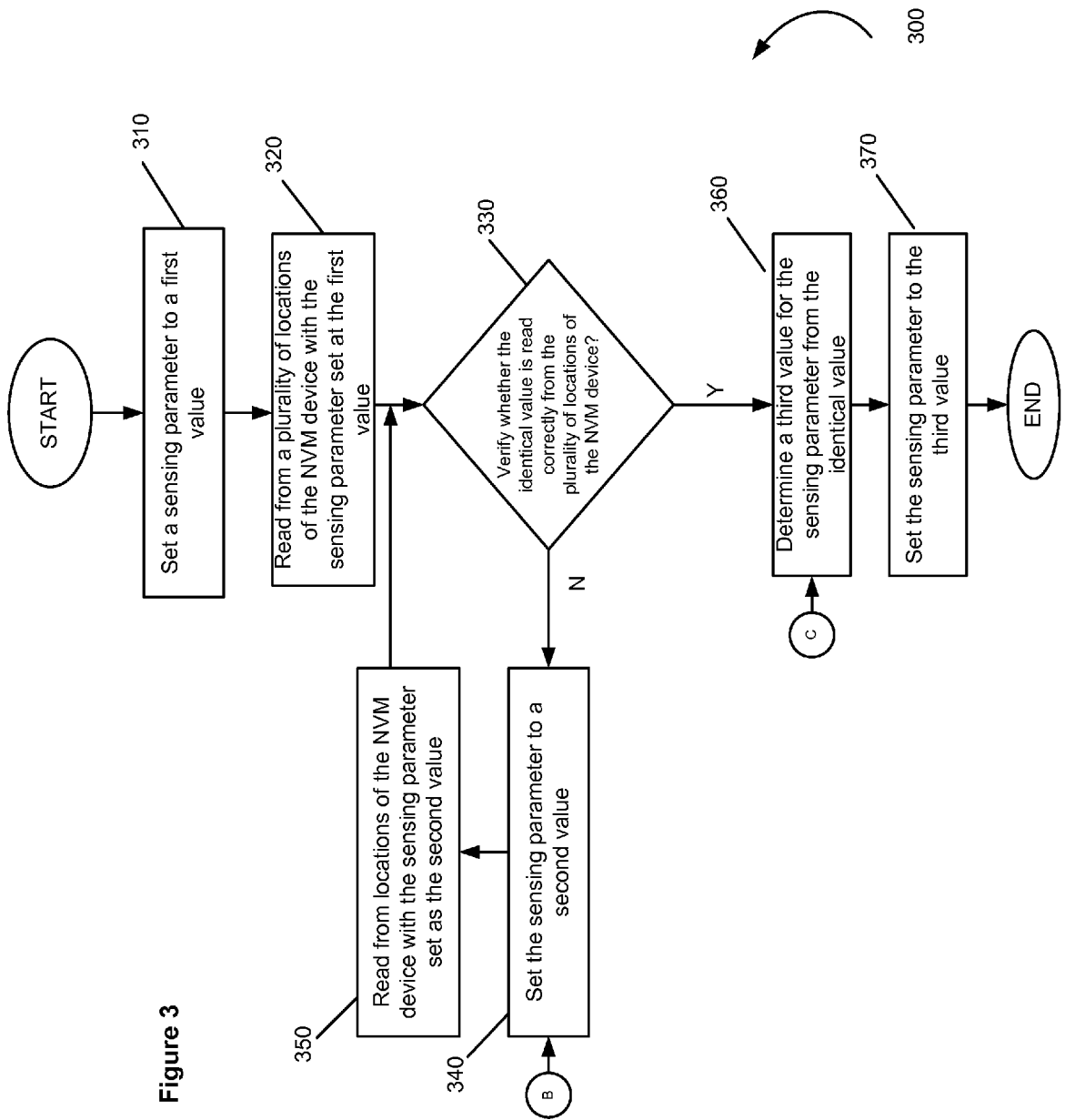
FIG. 3 is a flow chart illustrating a method of reading from a NVM at power up according to embodiments of the present invention.

FIG. 3 is a flow diagram of one embodiment of a method to enable reading from non-volatile memory devices. The method 300 is performed by processing logic that may comprise hardware (circuitry, dedicated logic, etc.), software (such as is run on a general purpose computing system or a dedicated machine), firmware (embedded software), or any combination thereof. In one embodiment, the controller device 110 of FIGS. 1 and 2 perform the method 300. Alternatively, other components of the NVM system 100, NVM system 200 or of both can perform some or all of the operations of method 300.

Referring to FIG. 3, processing logic begins upon power up from block 310 at which a sensing parameter is set to a first value. This sensing parameter is used to read data stored in the NVM device 102. At block 320, plurality of locations of the NVM device 102 are read with the sensing parameter set at the first value. As mentioned above, the locations of the NVM device 102 store an identical value. In one embodiment, the identical value is a pre-determined value. At block 330, verify whether the identical value is read correctly from the plurality of the locations of the NVM device 102. This is verified based on the sensing parameter set at the first value to ensure the accuracy of the reads. At block 340, the sensing parameter is set to a second value when the identical value is not read correctly with the sensing parameter set at the first value. At block 350, locations of the NVM device 102 are read with the sensing parameter set at the second value. At block 360, a third value for the sensing parameter is determined from the identical value when the identical value is read correctly. At block 370, the sensing parameter is set to the third value. In one embodiment, the third value is different from the first value. In other embodiment, the identical value is the third value.

Figure 4A:
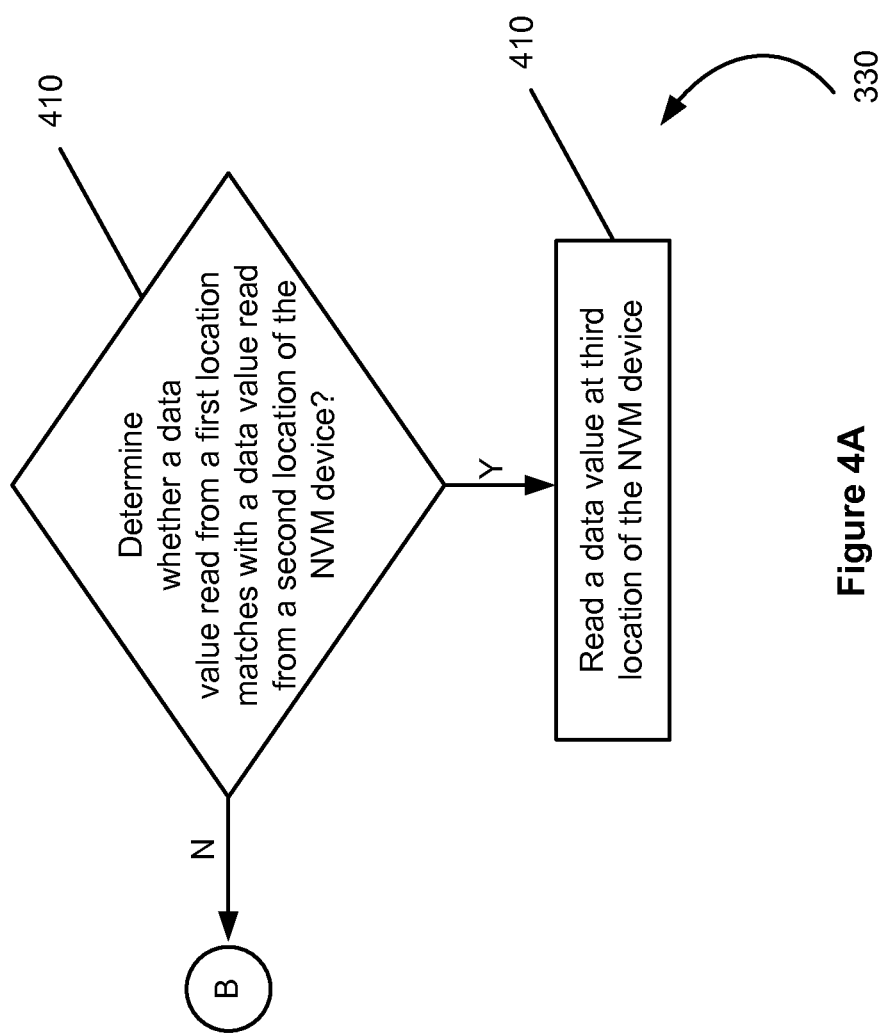
FIG. 4A is a flow chart illustrating a method of verifying correct read from the NVM at power up according to embodiments of the present invention.

FIG. 4A is one embodiment of a flow diagram of the block 330 of FIG. 3 to enable reading from the non-volatile memory devices. The method of the block 330 starts at block 410 where a data value read from a first location of the plurality of locations is compared with a data value read from a second location of the plurality of locations in the NVM device 102. If at block 410 it is determined that there is a no match between the data value read from the first location and the data value read from the second location, block 340 and the consecutive blocks in FIG. 3 are executed. If at block 410, it is determined that there is a match between the data value read from a first location and the data value read from the second location, at block 420, a data value is read at a third location of the plurality of locations in the NVM device 102. The method for the block 330 illustrated in FIG. 4 is repeated until the data values for successive locations from the plurality of the locations in the NVM device 102 are read and the compared with one another.

Figure 4B:
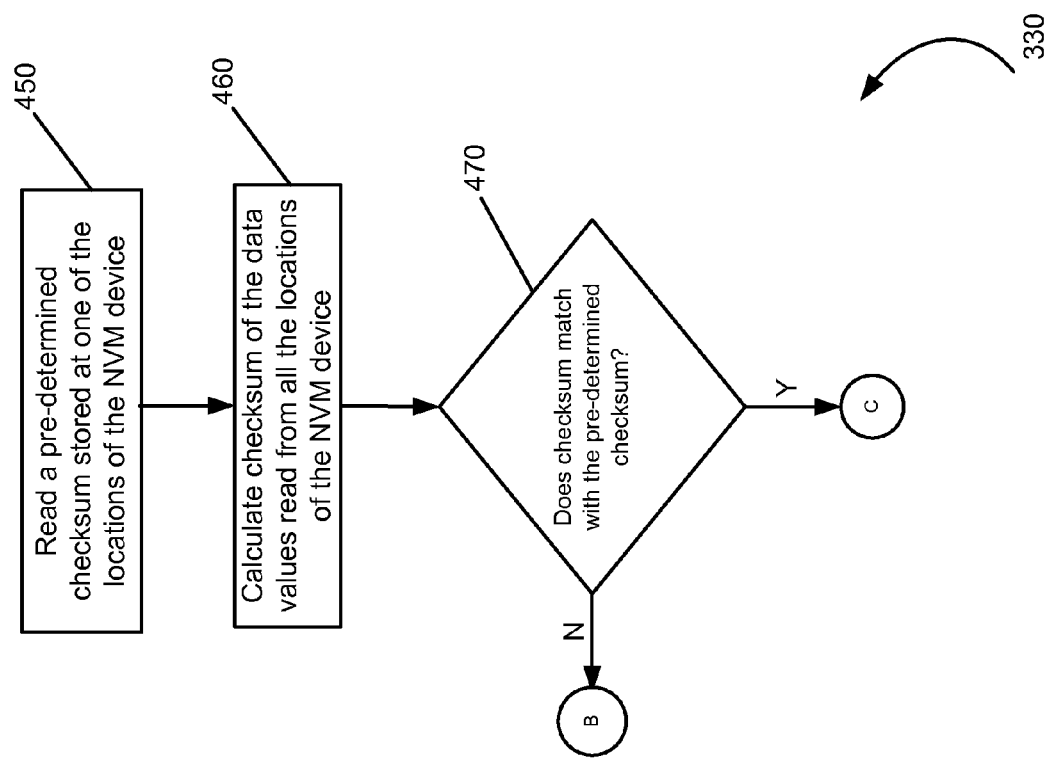
FIG. 4B is a flow chart illustrating a method of verifying correct read from the NVM at power up according to embodiments of the present invention.

FIG. 4B is one embodiment of the flow diagram of the block 330 of FIG. 3 to enable reading from the non-volatile memory device. The method of block 330 starts at block 450 where with the sensing parameter set at the first value, a pre-determined checksum of the identical values is read from one of the locations of the plurality of locations in the NVM device 102. This pre-determined checksum is determined and stored at the one of the locations prior to power up. In one embodiment, the pre-determined checksum is stored in another location of the plurality of locations of the NVM device 102. At block 460, a checksum is calculated of the data values read from the plurality of locations. In one embodiment, the checksum is the current checksum of the data values. At block 470, the checksum is compared with the predetermined checksum. If at block 470 checksum matches with the pre-determined checksum, block 360 and the consecutive block 370 in FIG. 3 are executed. If at block 470, if the checksum does not match with the pre-determined checksum, block 340 and the consecutive blocks in FIG. 3 are executed.

Figure 5:
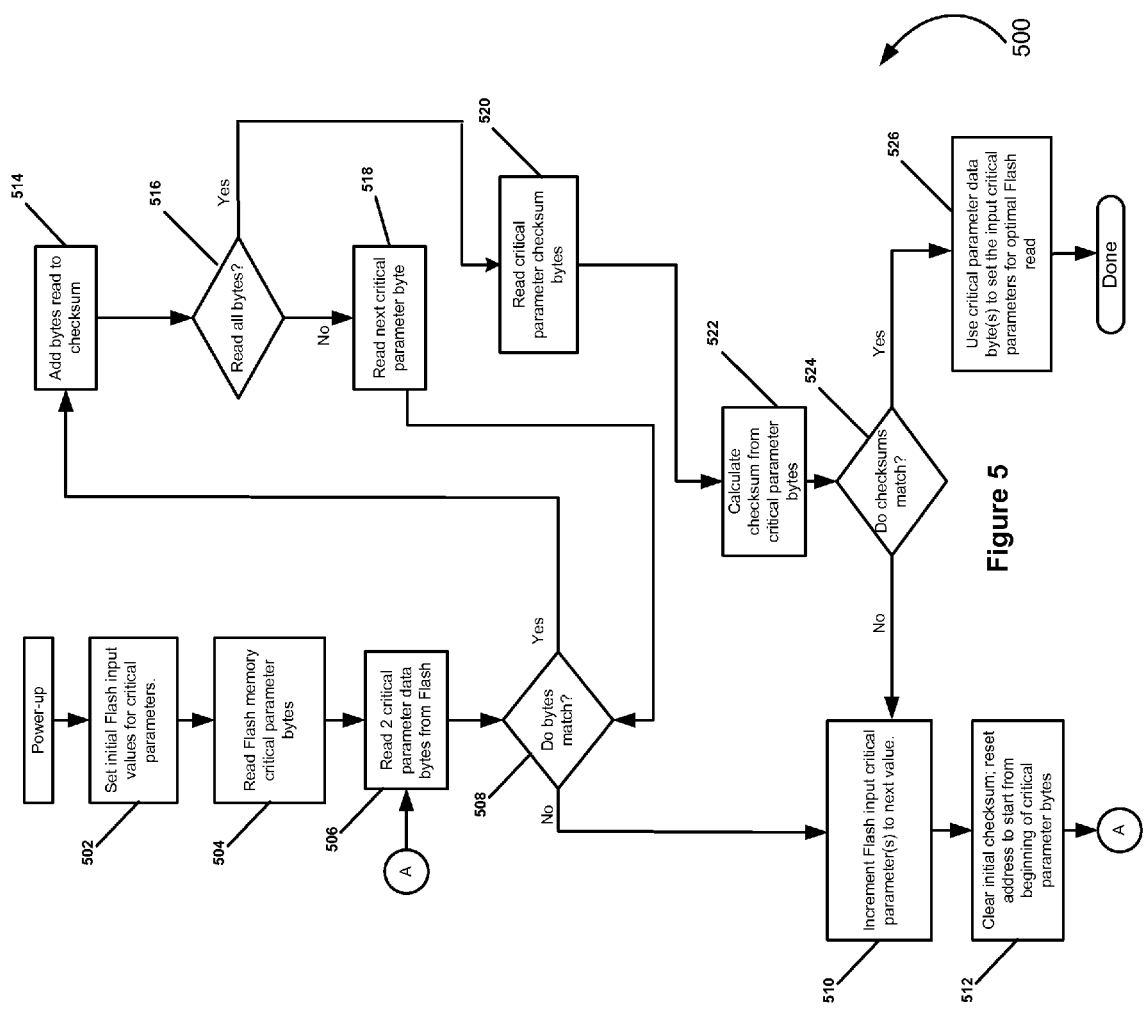
FIG. 5 is a flow chart illustrating a method of reading from a NVM at power up according to embodiments of the present invention.

FIG. 5 is a flow diagram of one embodiment of a method to enable reading from non-volatile memory devices. The method 500 is performed by processing logic that may comprise hardware (circuitry, dedicated logic, etc.), software (such as is run on a general purpose computing system or a dedicated machine), firmware (embedded software), or any combination thereof. In one embodiment, the controller device 110 of FIGS. 1 and 2 perform the method 500. Alternatively, other components of the NVM system 100, NVM system 200 or of both can perform some or all of the operations of method 500.

In the embodiment of FIG. 5, the NVM device 102 is a Flash memory (hereinafter 'Flash") and sensing parameters are critical parameters. Although the Flash is illustrated as disclosed as the NVM device 102, one of ordinary skill in the art would appreciate that other memories such as read only memory (ROM), Electrically Erasable Read Only Memory (EEROM) and most type of computer storage devices may be used as the NVM devices as would be appreciated by one of ordinary skill in the art having the benefit of this disclosure. Also, in the embodiment of FIG. 5, the plurality of locations in the parameter memory area 104 are the bytes, data bytes are the reads (data values read) from these locations and optimal Flash is the correct read value for future reads into the NVM device 102. Further in the embodiment of FIG. 5, the initial checksum is the pre-determined checksum and checksum is the current checksum.

Referring to FIG. 5, processing logic begins upon power up from block 502 at which an initial flash input values are set for critical parameters. At block 504, Flash memory critical parameter bytes are read. At block 506, two critical parameter data bytes from the Flash are read. At block 508, it is determined if the two critical parameter data bytes match. At block 510, Flash input critical parameter(s) are incremented to next value if the two critical data bytes do not match at block 508. At block 512, an initial checksum is cleared and address is reset to start from beginning of critical parameter bytes and method from block 506 is repeated. At block 514, bytes read are added to the checksum if the two critical data bytes do match at block 508. At block 516, it is determined whether all the bytes are read. At block 518, the next critical parameter byte is read and method from block 508 is repeated if it is determined that all the bytes are not read at block 516. At block 520, critical parameter checksum bytes are read if it is determined that all the bytes are read at block 514. At block 522, a checksum from the critical parameter bytes is calculated. At block 524, it is determined whether the checksum matches with the initial checksum. If it is determined at block 524 that the checksum does not match with the initial checksum, the method from block 510 is repeated. At block 526, critical parameter data bytes is used to set the input critical parameters for optimal Flash read if it is determined at block 524 that the checksum matches with the initial checksum.

Although in the embodiment described above, the sensing parameters disclosed are used to read into the NVM devices, one of ordinary skill in the art would appreciate that other parameters may also be used for setting other configurations including but not limited to data bus width(s), clock speed(s), other I/O configurations etc. as would be appreciated by one of ordinary skill in the art having the benefit of this disclosure.

The particular features, structures or characteristics described herein may be combined as suitable in one or more embodiments of the invention. In addition, while the invention has been described in terms of several embodiments, those skilled in the art will recognize that the invention is not limited to the embodiments described. The embodiments of the invention can be practiced with modification and alteration within the scope of the appended claims. The specification and the drawings are thus to be regarded as illustrative instead of limiting on the invention.

What is claimed is:

1. A method, implemented by a computing system programmed to perform the following, comprising:
   setting a sensing parameter, used to read data stored in a non-volatile memory (NVM) device, to a first value;
   reading a data value from each of a plurality of locations of the NVM device with the sensing parameter set at the first value, wherein the data value from each of the plurality of locations of the NVM device comprises a plurality of bits and is an identical value, wherein the identical value represents a configuration parameter for the NVM device;
   verifying whether the identical value is read correctly from the plurality of locations of the NVM device;
   setting the sensing parameter to a second value when the identical value is not read correctly with the sensing parameter set at the first value; and
   when the identical value is read correctly,
      determining a third value for the sensing parameter from the identical value, and
      setting the sensing parameter to the third value when the identical value is read correctly.

2. The method of claim 1 wherein the third value is different from the first value.

3. The method of claim 1 wherein the identical value is the third value.

4. The method of claim 1 wherein the sensing parameter is a current reference of a sensing window of the NVM device.

5. The method of claim 1 wherein the verifying comprising comparing the data value read from a first location of the plurality of the locations with the data value read from a second location of the plurality of the locations.

6. The method of claim 5 further comprising adjusting the sensing parameter to the second value when there is no match between the data value read from the first location and the data value read from the second location.

7. The method of claim 1 wherein said verifying comprises:
   with the sensing parameter set at the first value, reading a predetermined checksum of the identical values, wherein the predetermined checksum is stored in another location of the plurality of locations of the NVM device;
   calculating a checksum of the data value read from each of the plurality of locations of the NVM device; and
   comparing the checksum against the predetermined checksum, wherein the identical value is read correctly when the checksum matches the predetermined checksum.

8. The method of claim 7 further comprising adjusting the sensing parameter to the second value when there is no match between the checksum and the predetermined checksum.

9. The method of claim 7 further comprising reading from other locations of the NVM device with the sensing parameter set to the third value when the checksum matches the predetermined checksum.

10. A method, implemented by a computing system programmed to perform the following, comprising:
    setting a sensing parameter, used to read data stored in a non-volatile memory (NVM) device, to a first value;
    reading from a plurality of locations a predetermined value for the sensing parameter with the sensing parameter set at the first value, wherein each of the plurality of locations store stores the predetermined value, wherein the predetermined value from each of the plurality of locations comprises a plurality of bits and is identical;
    verifying whether the predetermined value is read correctly from the plurality of locations;
    setting the sensing parameter to the predetermined value when the predetermined value is read correctly from the plurality of locations; and
    when the predetermined value is not read correctly, iteratively setting the sensing parameter until the predetermined value is read correctly.

11. The method of claim 10, wherein the sensing parameter is a current reference of a sensing window of the NVM device.

12. The method of claim 10, wherein said verifying comprises:
    comparing data value read from a first location of the plurality of locations with data value read from a second location of the plurality of locations; and
    adjusting the sensing parameter to a second value when there is no match between the data values.

13. The method of claim 10, wherein said verifying comprises: with the sensing parameter set at the first value, reading a predetermined checksum of the predetermined values, wherein the predetermined checksum is stored in another location of the plurality of locations of NVM device;
    calculating a checksum of data values read from the plurality of locations of the NVM device; and
    comparing the checksum against the predetermined checksum, wherein the predetermined value is read correctly when the checksum matches the predetermined checksum.

14. The method of claim 13 further comprising:
    adjusting the sensing parameter to the second value when there is no match between the checksum and the predetermined checksum; and
    adjusting the sensing parameter to the predetermined value when there is a match between the checksum and the predetermined checksum.

15. A system comprising:
    a non-volatile memory (NVM) device; and
    a controller device coupled to the NVM device configured to set a first sensing parameter used to read data stored in the NVM device and read, using the first sensing parameter, a data value from each of a plurality of locations of the NVM device, wherein the data value from each of the plurality of locations of the NVM device comprises a plurality of bits, and is an identical value, wherein the identical value represents a configuration parameter for the NVM device, wherein the controller device is configured, using the first sensing parameter, to verify whether the identical value is read correctly at the plurality of locations of the NVM device, wherein the controller device is further configured to set a second sensing parameter when the identical value is not read correctly with the first sensing parameter, wherein the controller device is further configured to determine, using the first sensing parameter, a third sensing parameter, when the identical value is read correctly with the first sensing parameter and to set the third sensing parameter used to read the data stored in the NVM device when the identical value is read correctly.

16. The system of claim 15 wherein the third sensing parameter is different from the first sensing parameter.

17. The system of claim 15 wherein the identical value is the third sensing parameter.

18. The system of claim 15 wherein the first sensing parameter is a current reference of a sensing window of the NVM device.

19. The system of claim 15 wherein the controller device is configured to compare the data value read from a first location with the data value read from a second location of the plurality of locations.

20. The system of claim 15 wherein the controller device is configured to read, using the first sensing parameter, a predetermined checksum of the identical values, wherein the predetermined checksum is stored in another location of the plurality of locations of the NVM device, wherein the controller device is configured to calculate a checksum of data values read from the plurality of locations of the NVM device and to compare the checksum against the predetermined checksum.

* * * * *